United States Patent
Kimura et al.

(10) Patent No.: US 8,653,498 B2
(45) Date of Patent: Feb. 18, 2014

(54) SEMICONDUCTOR LIGHT EMITTING DEVICE

(75) Inventors: Shigeya Kimura, Kanagawa-ken (JP); Taisuke Sato, Kanagawa-ken (JP); Toshihide Ito, Tokyo (JP); Takahiro Sato, Kanagawa-ken (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 13/032,943

(22) Filed: Feb. 23, 2011

(65) Prior Publication Data

US 2012/0032139 A1    Feb. 9, 2012

(30) Foreign Application Priority Data

Aug. 4, 2010  (JP) ................................. 2010-175650
Jan. 26, 2011  (JP) ................................. 2011-014116

(51) Int. Cl.
  *H01L 33/40*   (2010.01)
  *H01L 33/04*   (2010.01)

(52) U.S. Cl.
  USPC ........ 257/13; 257/99; 257/103; 257/E33.008; 257/E33.068

(58) Field of Classification Search
  USPC .......... 257/13, 94, 98, 99, 100, 103, E33.008, 257/E33.063
  See application file for complete search history.

(56) References Cited

U.S. PATENT DOCUMENTS

| 6,603,152 B2 | 8/2003 | Song et al. |
| 6,642,548 B1 | 11/2003 | Brown et al. |
| 2010/0012971 A1* | 1/2010 | Hiraoka et al. ............... 257/103 |

FOREIGN PATENT DOCUMENTS

| JP | 5-59861 U | 8/1993 |
| JP | 10-256602 | 9/1998 |
| JP | 2001-308380 | 11/2001 |
| JP | 2001-345480 | 12/2001 |
| JP | 2003-133590 | 5/2003 |
| JP | 2007-73789 | 3/2007 |
| JP | 2008-227109 | 9/2008 |
| JP | 2011-71339 | 4/2011 |

OTHER PUBLICATIONS

Office Action issued on Nov. 7, 2011 in Japanese Patent Application No. 2011-014116 (with English translation).
Office Action issued Feb. 28, 2012 in Japan Application No. 2011-014116 (With English Translation).

(Continued)

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

According to one embodiment, a semiconductor light emitting device includes: a stacked structural body, a first electrode; and a second electrode. The stacked structural body includes a first semiconductor layer of n-type, a second semiconductor layer of p-type, and a light emitting portion provided therebetween. The first electrode includes a first contact electrode portion. The second electrode includes a second contact electrode portion and a p-side pad electrode. A sheet resistance of the second contact electrode portion is lower than a sheet resistance of the first semiconductor layer. The p-side pad electrode is provided farther inward than a circumscribed rectangle of the first contact electrode portion, and the first contact electrode portion is provided farther outward than a circumscribed rectangle of the p-side pad electrode.

20 Claims, 15 Drawing Sheets

(56) References Cited

OTHER PUBLICATIONS

A. Ebong, et al., "Device and circuit modeling of GaN/InGaN light emitting diodes (LEDs) for optimum current spreading", Solid State Electronics, vol. 47, Oct. 2003, pp. 1817-1823.

U.S. Appl. No. 13/029,462, filed Feb. 17, 2011, Sato, et al.
Japanese Decision of Refusal issued Jun. 1, 2012, in Japan Patent Application No. 2011-014116 (with English translation).
U.S. Appl. No. 12/875,632, filed Mar. 9, 2010, Shigeya Kimura et al.

* cited by examiner

US 8,653,498 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2010-175650, filed on Aug. 4, 2010 and the prior Japanese Patent Application No. 2011-014116, filed on Jan. 26, 2011; the entire contents of which are incorporated herein by reference.

FIELD

Embodiments described herein relate generally to a semiconductor light emitting device.

BACKGROUND

Utilizing the wide band gap characteristic of group III-V nitride compound semiconductors, group III-V nitride compound semiconductors have been applied to high luminance Light Emitting Diodes (LEDs) emitting from purple to blue or green light and Laser Diodes (LDs) emitting from violet to blue light. However, there is still room for improvement in the uniformization of current density distribution and light extraction efficiency.

DETAILED DESCRIPTION

Figure 1:
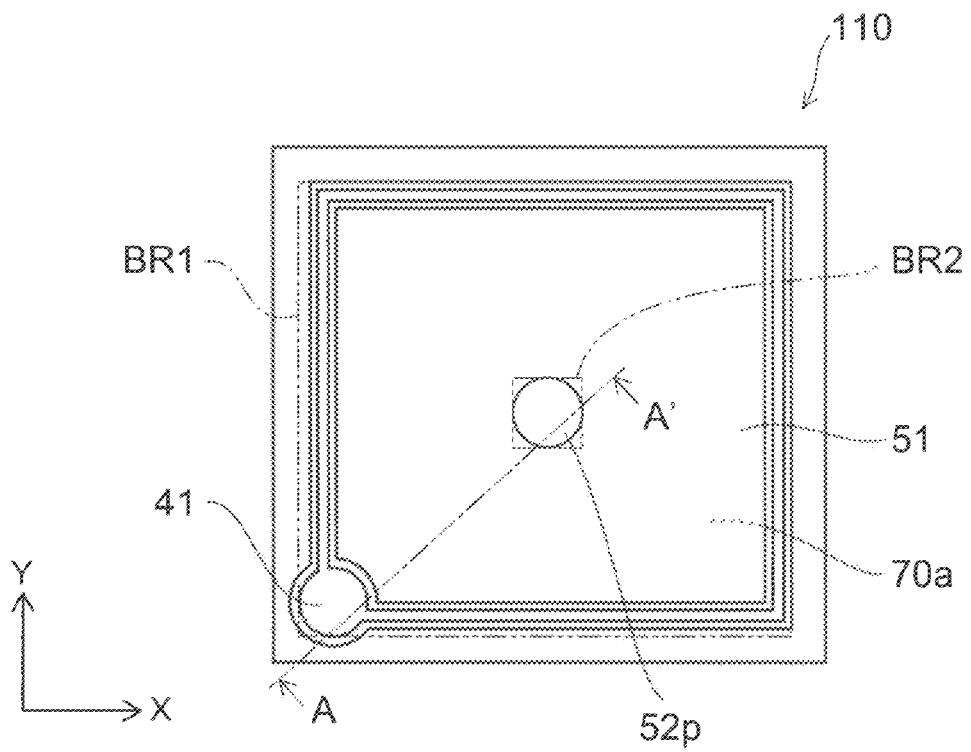
FIG. 1 is a schematic plan view illustrating a semiconductor light emitting device according to a first embodiment.

In general, according to one embodiment, a semiconductor light emitting device includes: a stacked structural body, a first electrode; and a second electrode. The stacked structural body includes a first semiconductor layer of n-type, a second semiconductor layer of p-type, and a light emitting portion provided therebetween. a part of the first semiconductor layer is exposed when viewed in a first direction from the second semiconductor layer to the first semiconductor layer. The first electrode includes a first contact electrode portion. The second electrode includes a second contact electrode portion and a p-side pad electrode. A sheet resistance of the second contact electrode portion is lower than a sheet resistance of the first semiconductor layer. The p-side pad electrode is provided farther inward than a circumscribed rectangle of the first contact electrode portion, and the first contact electrode portion is provided farther outward than a circumscribed rectangle of the p-side pad electrode.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings of the application, components similar to those described in regard to a drawing thereinabove are marked with like reference numerals, and a detailed description is omitted as appropriate.

(First Embodiment)

FIG. 1 is a schematic plan view illustrating a semiconductor light emitting device according to a first embodiment.

Figure 2:
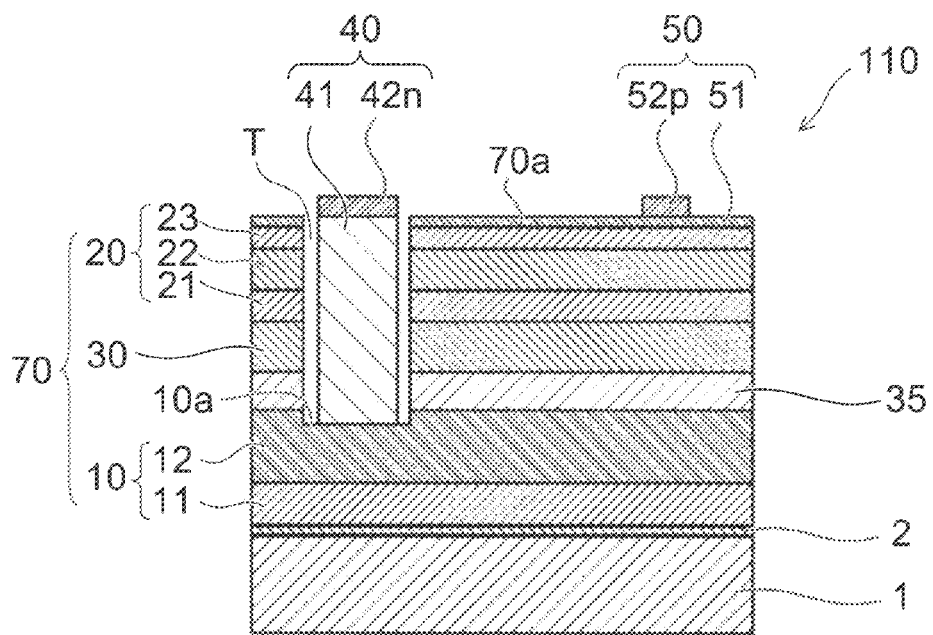
FIG. 2 is a schematic cross-sectional view taken along the line A-A' illustrated in FIG. 1.

FIG. 2 is a schematic cross-sectional view taken along the line A-A' illustrated in FIG. 1.

As illustrated in FIG. 2, a semiconductor light emitting device 110 according to the first embodiment includes a stacked structural body 70, a first electrode 40, and a second electrode 50. The stacked structural body 70 includes a first semiconductor layer 10 of a first conductivity type, a second semiconductor layer 20 of a second conductivity type, and a light emitting portion 30 provided between the first semiconductor layer 10 and the second semiconductor layer 20.

In this embodiment, a first conductivity type is n-type, and a second conductivity type is p-type.

The first electrode 40 includes a first contact electrode portion 41 in contact with a face 10a of the first semiconductor layer 10 exposed by selectively removing the second semiconductor layer 20 and the light emitting portion 30 of a first major surface 70a on a second semiconductor layer 20 side of the stacked structural body 70. In other words, a part of the first semiconductor layer 10 is exposed when viewed in a first direction from the second semiconductor layer 20 to the first semiconductor layer 10. The second electrode 50 includes a second contact electrode portion 51 that has translucency and is in contact with the second semiconductor layer 20

A sheet resistance Rt of the second contact electrode portion 51 is less than a sheet resistance of the first semiconductor layer 10 (in this embodiment, a sheet resistance Rn of the hereinafter described n-type contact layer 12)

Here, the sheet resistance Rt is a sheet resistance of a portion of the second contact electrode portion 51 having a homogenous thickness with the exception of a portion T where the second semiconductor layer 20 and the light emitting portion 30 have been selectively removed.

Additionally, the sheet resistance Rn is a sheet resistance of a portion of the first semiconductor layer 10 having a homogenous thickness (the n-type contact layer 12) with the exception of the portion T described above.

Sheet resistance is measured according to, for example, the method stipulated in Japanese Industrial Standard (JIS) C 2525.

Note that in the semiconductor light emitting device 110 according to this embodiment, a relationship between a resistance of the second contact electrode portion 51 and a resistance of the first semiconductor layer 10 is defined by sheet resistance, but can also be defined by volume resistivity. In other words, in the semiconductor light emitting device 110 according to this embodiment, a value of a volume resistivity divided by a thickness of the second contact electrode portion 51 is less than a value of a volume resistivity divided by a thickness of the first semiconductor layer 10.

In such a semiconductor light emitting device 110 it is possible to use an electrode structure that achieves the uniformization of current density distribution while suppressing the loss of light extraction efficiency.

The semiconductor light emitting device 110 according to this embodiment is, for example, a nitride semiconductor Light Emitting Diode (LED).

In the semiconductor light emitting device 110, for example, a buffer layer 2 is provided on a substrate 1 made from, for example, a C face sapphire; and, for example, an undoped nitride semiconductor layer 11 and the n-type contact layer 12 are provided thereon. GaN is used, for example, for the n-type contact layer 12. GaN is used, for example, for the undoped nitride semiconductor layer 11. The n-type contact layer 12 is included in the first semiconductor layer 10. In this embodiment, for convenience, the undoped nitride semiconductor layer 11 is also included in the first semiconductor layer 10.

A multiple stacked body 35 is provided on the n-type contact layer 12. In the multiple stacked body 35, for example, a plurality of first layers and a plurality of second layers are alternately stacked. The multiple stacked body 35 has, for example, a superlattice structure.

The light emitting portion 30 (active layer) is provided on the multiple stacked body 35. The light emitting portion 30 has, for example, a Multiple Quantum Well (MQW) structure. Specifically, the light emitting portion 30 includes a structure in which a plurality of barrier layers and a plurality of well layers are repeatedly, alternately stacked. In the light emitting portion 30, the groups of barrier layers sandwiching the well layers may have a Single Quantum Well (SQW) structure provided per group.

For example, a p-type AlGaN layer 21, a p-type (i.e. Mg doped) GaN layer 22, and a p-type contact layer 23 are subsequently provided on the light emitting portion 30. The p-type AlGaN layer 21 functions as, for example, an electron overflow preventing (suppressing) layer. GaN is used, for example, for the p-type contact layer 23. The p-type AlGaN layer 21, the Mg doped GaN layer 22, and the p-type contact layer 23 are included in the second semiconductor layer 20. Additionally, the second contact electrode portion 51 that is a transparent electrode is provided on the p-type contact layer 23.

Moreover, a portion of the n-type contact layer 12 that is the first semiconductor layer 10, and the multiple stacked body 35, the light emitting portion 30, and the second semiconductor layer 20 that correspond to that portion are removed. The first contact electrode portion 41 is provided on the exposed face 10a of the n-type contact layer 12.

A stacked structure of, for example, Ti/Al/Ta/Ti/Pt is used for the first contact electrode portion 41. Additionally, an n-side pad electrode 42n is provided on the first contact electrode portion 41. A stacked structure of, for example, Ni/Au is used for the n-side pad electrode 42n. The n-side pad electrode 42n may be provided on a portion of the first contact electrode portion 41 or on an entirety of the surface of the first contact electrode portion 41.

A p-side pad electrode 52p is provided on a portion of the second contact electrode portion 51. Transparency of the p-side pad electrode 52p is lower than transparency of the second contact electrode portion 51. A stacked structure of, for example, Ni/Au is used for the p-side pad electrode 52p.

The materials described for the first contact electrode portion 41, the n-side pad electrode 42n, the second contact electrode portion 51, and the p-side pad electrode 52p, are given as examples and are not limited to this embodiment.

With an electrode arrangement such as in the semiconductor light emitting device 110, the first electrode 40 and the second electrode 50 are on the same side in a "face-up" configuration. In the "face-up" semiconductor light emitting device 110, containment in a package is easy. On the other hand, current density distribution in a chip is prone to becoming uneven. As such, in this embodiment, an electrode structure such as follows is used.

As illustrated in FIG. 1, in the semiconductor light emitting device 110 according to this embodiment, when viewed planarly from the second semiconductor layer 20 side of the stacked structural body 70, the p-side pad electrode 52p is provided farther inward than a circumscribed rectangle BR1 of the first contact electrode portion 41. Furthermore, the first contact electrode portion 41 is provided farther outward than a circumscribed rectangle BR2 of the p-side pad electrode 52p.

In this embodiment, "circumscribed rectangle" refers to rectangles that contact each outer periphery of the electrodes 41 and 52p. Furthermore, "circumscribed rectangle" refers to rectangles along two orthogonal directions (in the drawing, an X direction and a Y direction: a second direction) of a planarly viewed outer periphery of the semiconductor light emitting device 110.

Thereby, current flows in a radiation direction from the p-side pad electrode 52p toward the first contact electrode portion 41, and, due to the current density distribution being dispersed, uniformization of the luminescence distribution is achieved.

Figure 3:
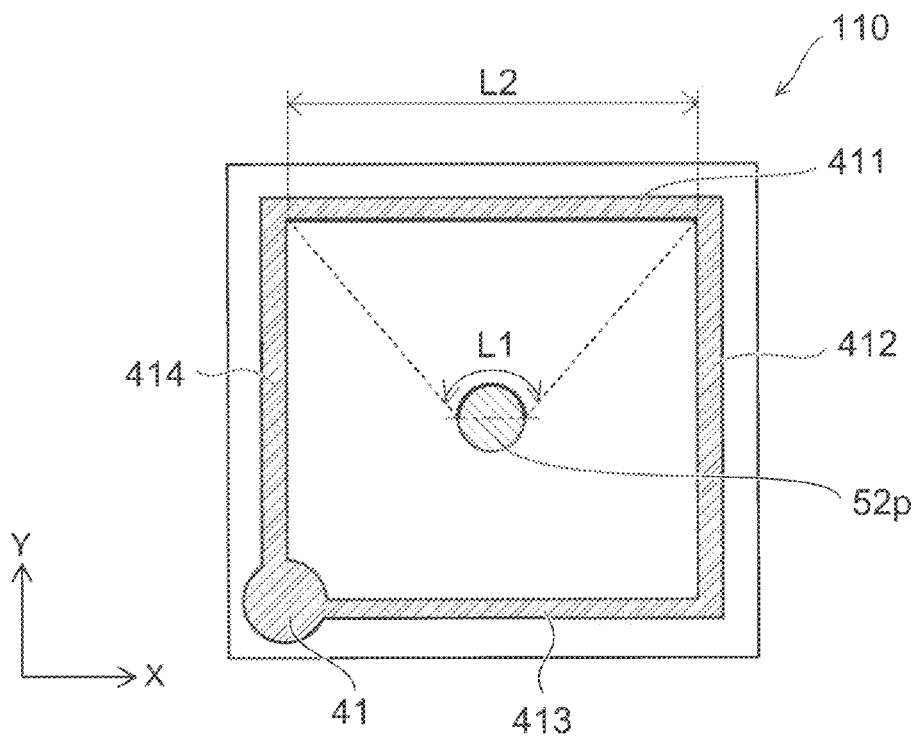
FIG. 3 is a schematic plan view illustrating lengths of opposing portions of the electrodes that face each other.

FIG. 3 is a schematic plan view illustrating lengths of opposing portions of the electrodes that face each other.

In this drawing, a rectangular first contact electrode portion 41 is provided so as to surround a periphery of the p-side pad electrode 52p.

A first length L1 illustrated in this drawing is a length of the p-side pad electrode 52p, of the opposing portion facing an extending part 411, along an X direction of the first contact electrode portion 41.

Additionally, a second length L2 illustrated in this drawing is a length of the extending part 411 of the first contact electrode portion 41, of the opposing portion facing the p-side pad electrode 52p.

In the semiconductor light emitting device 110 according to this embodiment, the first length L1 is shorter than the second length L2.

The relationship between the first length L1 and the second length L2 is the same for extending parts 412 to 414 as for the first contact electrode portion 41. Due to such a relationship, current flows in a radiation direction from the p-side pad electrode 52p toward the first contact electrode portion 41 and the dispersion of current density distribution is achieved. Thereby, in the semiconductor light emitting device 110, luminescence distribution is made uniform.

Hereinafter, an example of the semiconductor light emitting device will be described.

Figure 4:
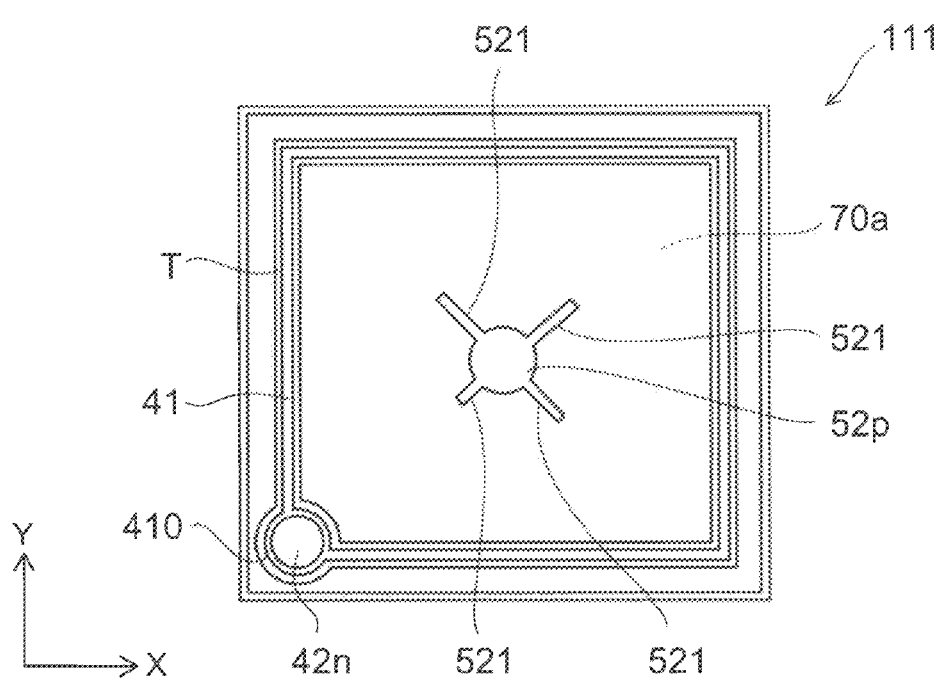
FIG. 4 is a schematic plan view illustrating a first example.

FIG. 4 is a schematic plan view illustrating a first example.

As illustrated in FIG. 4, in a semiconductor light emitting device 111 according to the first example, the rectangular first contact electrode portion 41 is provided so as to surround an entirety of the periphery along the first major surface 70a of the p-side pad electrode 52p.

The semiconductor light emitting device 111 has a removed portion T where a portion of the n-type contact layer 12, and the multiple stacked body 35, the light emitting portion 30, and the second semiconductor layer 20 corresponding to that portion are rectangularly removed. The first contact electrode portion 41 is provided along the removed portion T, and is in contact with the n-type contact layer 12 at a bottom surface of the removed portion T (the face 10a illustrated in FIG. 2).

A bulged portion 410 that is, for example, rounded is provided in at least one corner of the rectangular first contact electrode portion 41. The n-side pad electrode 42n is provided in the bulged portion 410. A shape of the n-side pad electrode 42n is, for example, circular or rectangular. If the n-side pad electrode 42n is circular, a diameter can be, for example, approximately not less than 50 micrometers (μm) and not more than 100 μm. If the n-side pad electrode 42n is rectangular, one side can be, for example, approximately not less than 50 μm and not more than 100 μm. A thickness of the first contact electrode portion 41 can be approximately not less than 100 nanometers (nm) and not more than 500 nm, and is preferably approximately 300 nm.

A size of the n-side pad electrode 42n is a size that allows for connectability of bonding wire, and is less than or equal to a size of the bulged portion 410 of the first contact electrode portion 41. The n-side pad electrode 42n may be provided on a portion of the first contact electrode portion 41 or may be provided on the entirety of the first contact electrode portion 41.

The second contact electrode portion 51 that is a transparent electrode is, for example, Indium Tin Oxide (ITO). A film thickness of the second contact electrode portion 51 can be, for example, approximately not less than 100 nm and not more than 300 nm. In this embodiment, the sheet resistance Rt of the second contact electrode portion 51 is less than the sheet resistance Rn of the n-type contact layer 12.

Here, in the n-type contact layer 12, an amount of silicon (Si) that the layer is doped with is preferably approximately not less than $1.0 \times 10^{18}/cm^3$ and not more than $1.0 \times 10^{19}/cm^3$. On the other hand, when using ITO for the second contact electrode portion 51, a sheet resistance Rt of the ITO is variable depending on film forming conditions and film thickness. For example, the sheet resistance Rt is not less than 5Ω/square and not more than 12Ω/square, preferably and not more than 10Ω/square, and more preferably and not more than 8Ω/square. With the range of conditions described above, sheet resistance Rt<sheet resistance Rn is made to be satisfied.

The p-side pad electrode 52p is provided on a portion of the second contact electrode portion 51. A shape of the p-side pad electrode 52p is, for example, circular or rectangular. In this embodiment, a circular p-side pad electrode 52p is described as an example. A size of the p-side pad electrode 52p is a size that allows for connectability of bonding wire.

Additionally, an extending electrode 521 is provided in the p-side pad electrode 52p as desired. In the semiconductor light emitting device 111 illustrated in FIG. 4, four of the extending electrodes 521 are provided, extending from the p-side pad electrode 52p toward each corner of the rectangular first contact electrode portion 41. Specifically, in a corner of the first contact electrode portion 41, a distance from the periphery of the circular p-side pad electrode 52p to an extension of the first contact electrode portion 41 along a normal direction is longer compared to other portions. Therefore, the extending electrodes 521 are provided extending from the p-side pad electrode 52p toward each corner of the first contact electrode portion 41, and lengthening of the distance described above is prevented. The extending electrode 521 provided extending toward the corner having the bulged portion 410 is shorter than the other extending electrodes 521. Thereby, current density distribution is balanced.

In the semiconductor light emitting device 111, the p-side pad electrode 52p is provided on an inner side of the rectangular first contact electrode portion 41. Specifically, the p-side pad electrode 52p is provided on an inner side of a circumscribed rectangle of the first contact electrode portion 41 when viewed planarly. Additionally, the first contact electrode portion 41 is provided on an outer side of a circumscribed rectangle of the p-side pad electrode 52p when viewed planarly.

Thereby, current flows in a radiation direction from the p-side pad electrode 52p toward the first contact electrode portion 41, and dispersion of the current density distribution is achieved. As a result, luminescence distribution of the semiconductor light emitting device 111 is made uniform.

Figure 5:
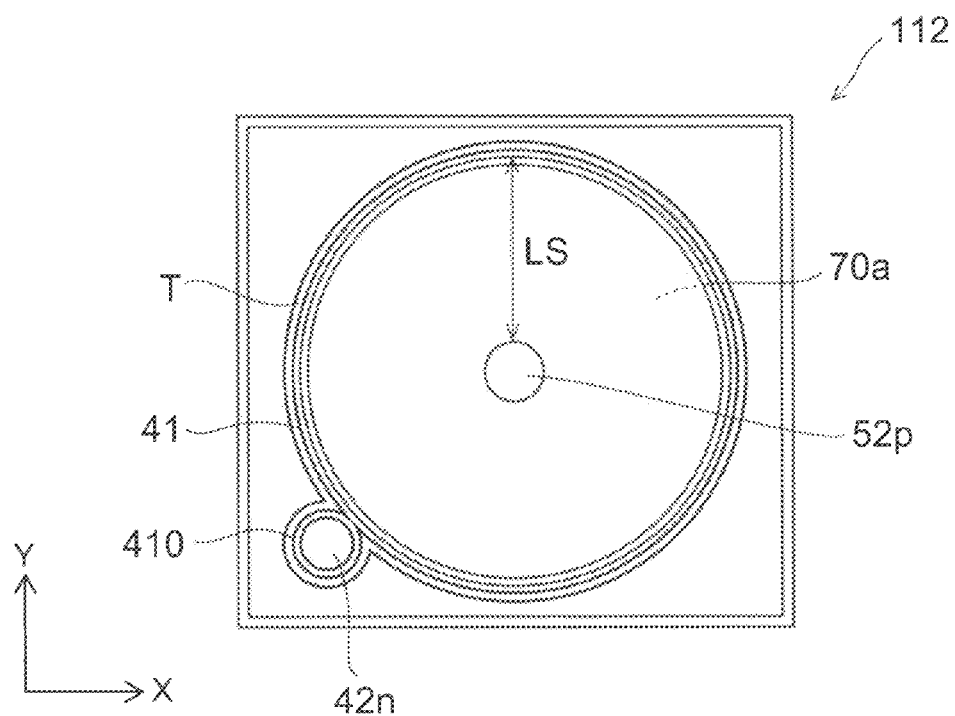
FIG. 5 is a schematic plan view illustrating a second example.

FIG. 5 is a schematic plan view illustrating a second example.

As illustrated in FIG. 5, in a semiconductor light emitting device 112 according to the second example, the circular first contact electrode portion 41 is provided so as to surround the entirety of the periphery along the first major surface 70a of the p-side pad electrode 52p.

The semiconductor light emitting device 112 has a removed portion T where a portion of the n-type contact layer 12, and the multiple stacked body 35, the light emitting portion 30, and the second semiconductor layer 20 corresponding to that portion are circularly removed. The first contact electrode portion 41 is provided along the removed portion T, and is in contact with the n-type contact layer 12 at a bottom surface of the removed portion T (the face 10a illustrated in FIG. 2).

A bulged portion 410 that is, for example, rounded is provided in at least one location of the first contact electrode portion 41. The n-side pad electrode 42n is provided in the bulged portion 410. A shape of the n-side pad electrode 42n is, for example, circular or rectangular. The n-side pad electrode 42n may be provided on a portion of the first contact electrode portion 41 or may be provided on the entirety of the first contact electrode portion 41.

The second contact electrode portion 51 that is a transparent electrode is, for example, Indium Tin Oxide (ITO). The sheet resistance Rt of the second contact electrode portion 51 is less than the sheet resistance Rn of the n-type contact layer 12.

With the exception of the bulged portion 410, the p-side pad electrode 52p in contact with the second contact electrode portion 51 is provided in a center of the circular first contact electrode portion 41. A shape of the p-side pad electrode 52p is circular. Specifically, the p-side pad electrode 52p is provided on an inner side of the circumscribed rectangle of the first contact electrode portion 41 when viewed planarly. Additionally, the first contact electrode portion 41 is provided on an outer side of the circumscribed rectangle of the p-side pad electrode 52p when viewed planarly.

In such a disposition of the p-side pad electrode 52p and the first contact electrode portion 41, a minimum distance LS between the outer periphery of the p-side pad electrode 52p and the inner periphery of the first contact electrode portion 41 is equivalent along an entire circumference of the outer periphery of the p-side pad electrode 52p.

Thereby, current flows in a radiation direction from the p-side pad electrode 52p toward the first contact electrode portion 41, and dispersion of the current density distribution is achieved. In the semiconductor light emitting device 112, the minimum distance LS is equivalent along the entire circumference of the outer periphery of the p-side pad electrode 52p. Therefore, a uniform current density distribution from the p-side pad electrode 52p toward the first contact electrode portion 41 can be realized. As a result, luminescence distribution of the semiconductor light emitting device 112 is made uniform.

Figure 6:
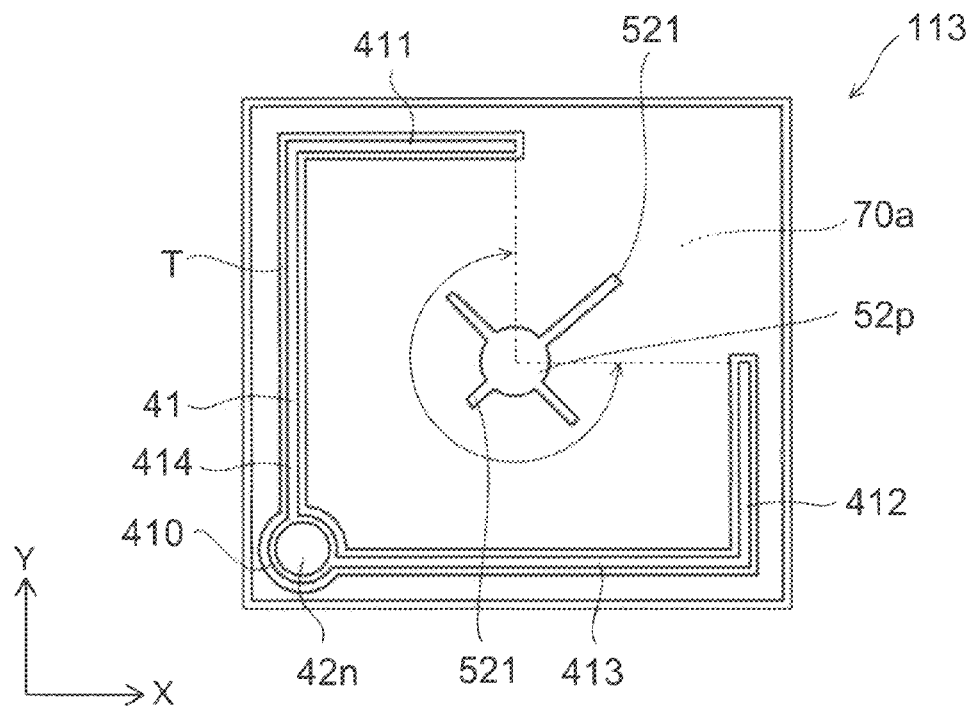
FIG. 6 is a schematic plan view illustrating a third example.

FIG. 6 is a schematic plan view illustrating a third example.

As illustrated in FIG. 6, in a semiconductor light emitting device 113 according to the third example, the first contact electrode portion 41 is provided so as to surround not less than 180 degrees of the periphery along the first major surface 70a of the p-side pad electrode 52p. In other words, the first contact electrode portion 41 surrounds not less than 180 degrees of the periphery of the p-side pad electrode 52p along the second direction.

In the first contact electrode portion 41 illustrated in FIG. 6, an extending part 413 extends in the X direction and an extending part 414 extends in the Y direction from the bulged portion 410 provided in a corner of the semiconductor light emitting device 113. Additionally, an extending part 412 extends in the Y direction from an end of a side of the extending part 413 opposite the bulged portion 410. The extending part 412 extends partway along a side of the semiconductor light emitting device 113 along the Y direction. Additionally, an extending part 411 extends in the X direction from an end of a side of the extending part 414 opposite the bulged portion 410. The extending part 411 extends partway along a side of the semiconductor light emitting device 113 along the X direction.

Specifically, the first contact electrode portion 41 is provided so as to surround not less than 180 degrees but less than 360 degrees of a periphery along the first major surface 70a of the p-side pad electrode 52p.

Additionally, an extending electrode 521 is provided in the p-side pad electrode 52p as desired. In the semiconductor light emitting device 113 illustrated in FIG. 6, four of the extending electrodes 521 are provided, extending from the p-side pad electrode 52p toward each corner of the rectangular first contact electrode portion 41.

In the semiconductor light emitting device 113, the p-side pad electrode 52p is provided on an inner side of the circumscribed rectangle of the first contact electrode portion 41 when viewed planarly. Additionally, the first contact electrode portion 41 is provided on an outer side of the circumscribed rectangle of the p-side pad electrode 52p when viewed planarly.

Thereby, current flows in a radiation direction from the p-side pad electrode 52p toward the first contact electrode portion 41, and dispersion of the current density distribution is achieved. As a result, luminescence distribution of the semiconductor light emitting device 113 is made uniform.

Figure 7:
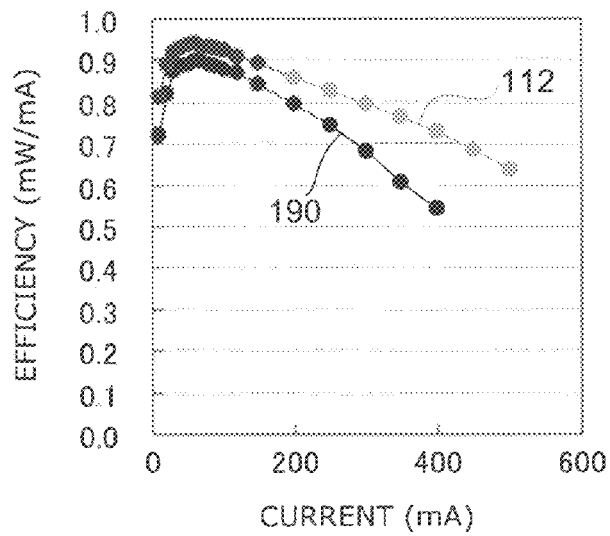
FIG. 7 is a chart showing a relationship between current and luminous efficiency of the semiconductor light emitting devices.

FIG. 7 is a chart showing a relationship between current and luminous efficiency of the semiconductor light emitting devices.

Figure 8:
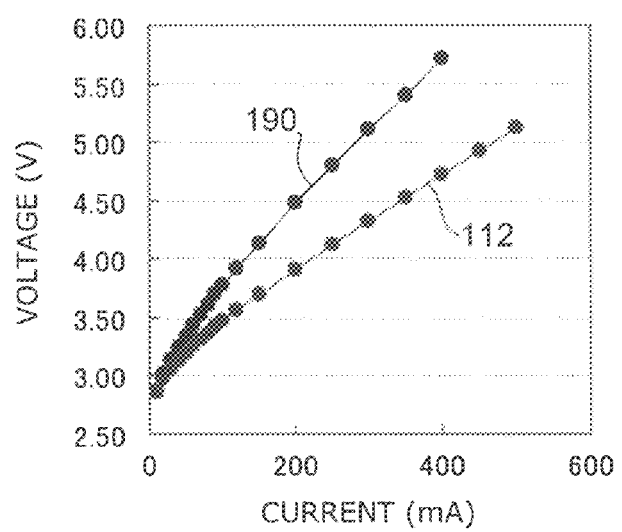
FIG. 8 is a chart showing a relationship between current and voltage of the semiconductor light emitting devices.

FIG. 8 is a chart showing a relationship between current and voltage of the semiconductor light emitting devices.

Figure 9:
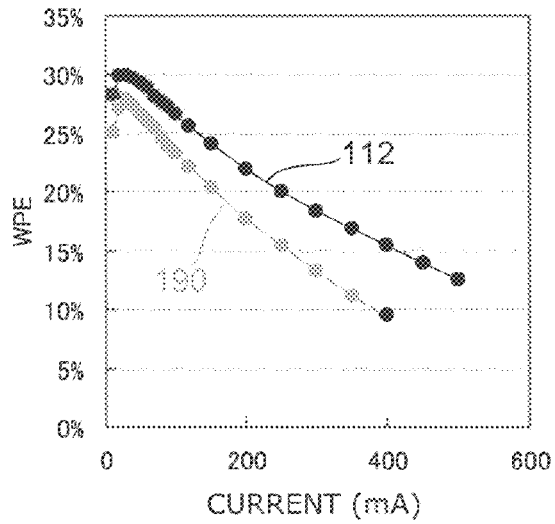
FIG. 9 is a chart showing a relationship between current and wall plug efficiency of the semiconductor light emitting devices.

FIG. 9 is a chart showing a relationship between current and wall plug efficiency of the semiconductor light emitting devices.

In FIGS. 7 to 9, the relationships for the semiconductor light emitting device 112 and a semiconductor light emitting device 190 according to a comparative example are each shown. The semiconductor light emitting device 190 according to the comparative example has a structure in which a circular p-side pad electrode is provided on a periphery, having a first contact electrode portion 41 in contact with the n-type contact layer 12 as a center.

As illustrated in FIG. 7, in the semiconductor light emitting device 112 according to this embodiment, compared with the semiconductor light emitting device 190 according to the comparative example, luminous efficiency per current is high. Particularly, a difference in luminous efficiency is significantly displayed as the current is increased.

As illustrated in FIG. 8, in the semiconductor light emitting device 112 according to this embodiment, compared with the semiconductor light emitting device 190 according to the comparative example, voltage per the same current is low. In other words, the semiconductor light emitting device 112 displays lower resistance than the semiconductor light emitting device 190.

As illustrated in FIG. 9, in the semiconductor light emitting device 112 according to this embodiment, compared with the semiconductor light emitting device 190 according to the comparative example, wall plug efficiency per current is high. Here, when input voltage is V, current is I, and output is Po, the wall plug efficiency WPE is expressed as WPE=Po/(I·V).

FIGS. 10A and 10B and FIGS. 11A and 11B illustrate luminous intensity at locations between the p-side and the n-side electrodes.

Figure 10A:
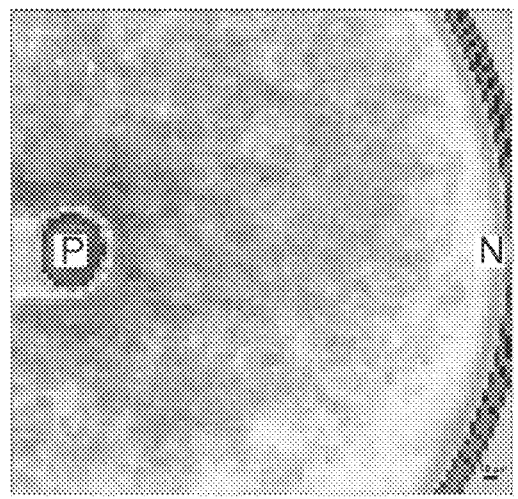
FIGS. 10A and 10B illustrate an example of luminous intensity of the semiconductor light emitting device 112 according to this embodiment.
Figure 10B:
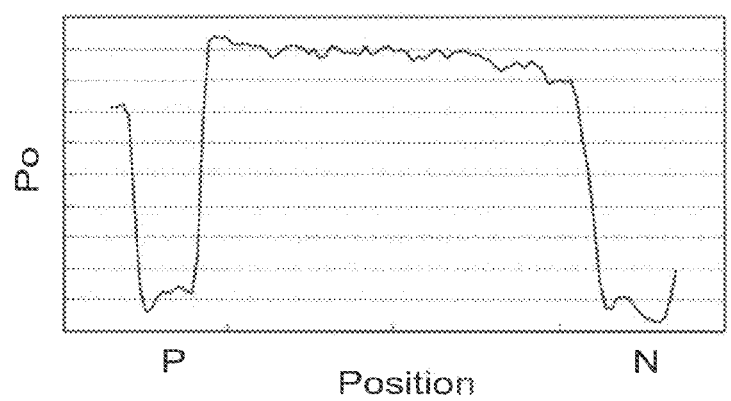
Figure 11A:
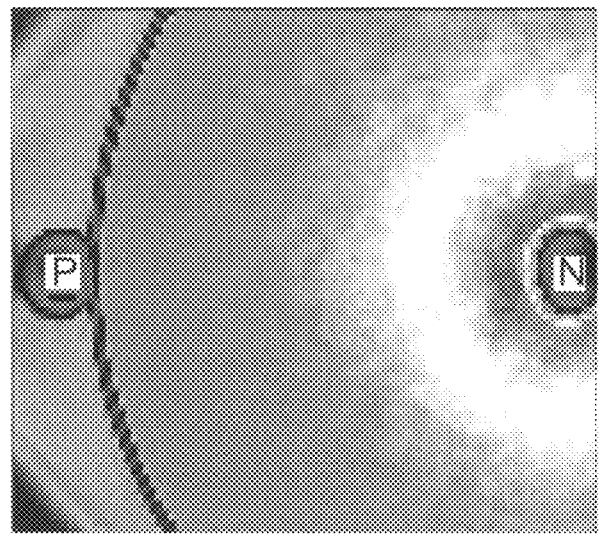
FIGS. 11A and 11B illustrate an example of luminous intensity of the semiconductor light emitting device 190 according to the comparative example.
Figure 11B:
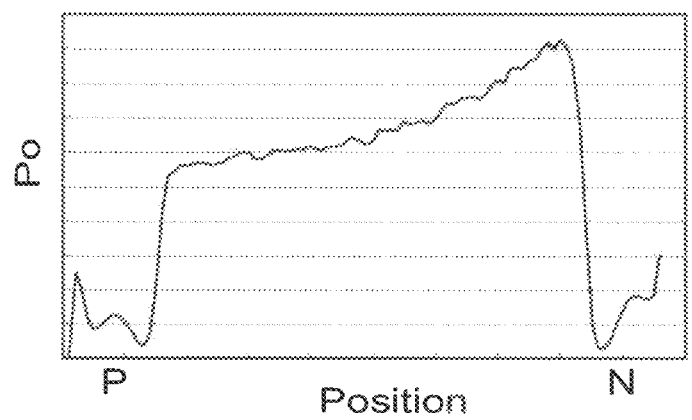

FIGS. 10A and 10B illustrate an example of luminous intensity of the semiconductor light emitting device 112 according to this embodiment and FIGS. 11A and 11B illustrate an example of luminous intensity of the semiconductor light emitting device 190 according to the comparative example.

Both FIG. 10A and FIG. 11A illustrate luminescence distributions between the p-side and the n-side electrodes in light/dark shades, and both FIG. 10B and FIG. 11B are graphs showing luminescence distributions between the p-side and the n-side electrodes. In each of FIG. 10A and FIG. 11A, darker shades indicate lower luminous intensities, and lighter shades indicate higher luminous intensities.

As illustrated in FIGS. 10A and 10B and FIGS. 11A and 11B, the semiconductor light emitting device 112 according to this embodiment, compared with the semiconductor light emitting device 190 according to the comparative example, achieves uniform luminous intensity.

(Second Embodiment)

Next, a semiconductor light emitting device according to a second embodiment will be described.

The semiconductor light emitting device according to the second embodiment is an example in which a plurality of first contact electrode portions 41 are provided.

Hereinafter, an example of the semiconductor light emitting device according to the second embodiment is described. In the following example, descriptions will be centered on the placement of electrodes of each semiconductor light emitting device, when viewed planarly.

Figure 12:
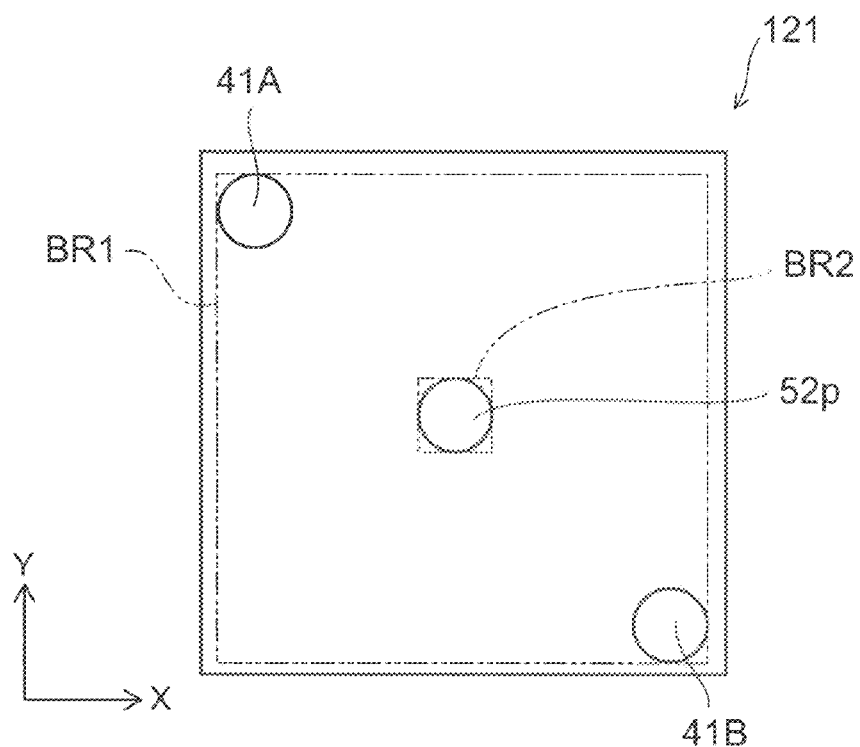
FIG. 12 is a schematic plan view illustrating a first example.

FIG. 12 is a schematic plan view illustrating a first example. As illustrated in FIG. 12, in a semiconductor light emitting device 121 illustrating a first example, a p-side pad electrode 52p is provided between two first contact electrode portions 41A and 41B.

The two first contact electrode portions 41A and 41B are disposed in diagonally opposite corners of the rectangular semiconductor light emitting device 121. The p-side pad electrode 52p is disposed between the two first contact electrode portions 41A and 41B, for example, in a center of the semiconductor light emitting device 121, when viewed planarly.

In the semiconductor light emitting device 121, the p-side pad electrode 52p is provided on an inner side of a circumscribed rectangle BR1 of the two first contact electrode portions 41A and 41B when viewed planarly. Additionally, the two first contact electrode portions 41A and 41B are each provided on an outer side of a circumscribed rectangle BR2 of the p-side pad electrode 52p when viewed planarly.

Thereby, current flows from the p-side pad electrode 52p toward each of the two first contact electrode portions 41A and 41B, and dispersion of the current density distribution is achieved. As a result, luminescence distribution of the semiconductor light emitting device 121 is made uniform.

Figure 13:
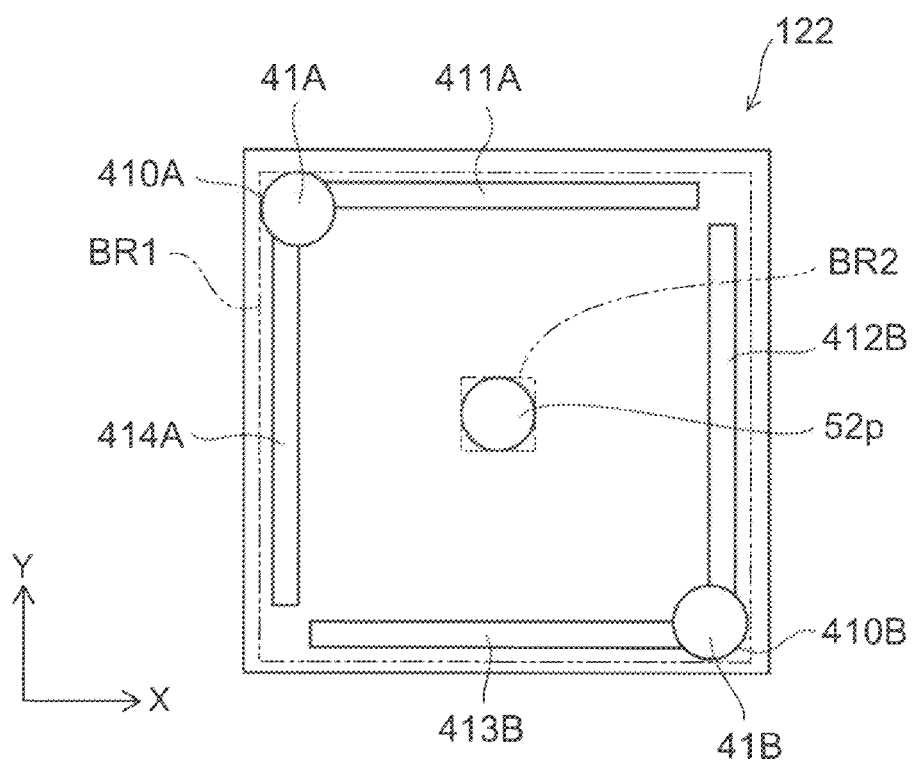
FIG. 13 is a schematic plan view illustrating a second example.

FIG. 13 is a schematic plan view illustrating a second example.

As illustrated in FIG. 13, in a semiconductor light emitting device 122 illustrating a second example, a p-side pad electrode 52p is provided between the two first contact electrode portions 41A and 41B.

The two first contact electrode portions 41A and 41B are disposed in opposite corners of the rectangular semiconductor light emitting device 122. The p-side pad electrode 52p is disposed between the two first contact electrode portions 41A and 41B, for example, in a center of the semiconductor light emitting device 122, when viewed planarly.

In the semiconductor light emitting device 122, two extending parts 411A and 414A are included in the first contact electrode portion 41A. Additionally, two extending parts 412B and 413B are included in the first contact electrode portion 41B.

The extending part 411A extends in the X direction from a bulged portion 410A. The extending part 414A extends in the Y direction from the bulged portion 410A. Additionally, the extending part 412B extends in the Y direction from a bulged portion 410B. The extending part 413B extends in the X direction from the bulged portion 410B.

In the semiconductor light emitting device 122, the p-side pad electrode 52p is provided on an inner side of a circumscribed rectangle BR1 of the two first contact electrode portions 41A and 41B when viewed planarly. Additionally, the two first contact electrode portions 41A and 41B are each provided on an outer side of a circumscribed rectangle BR2 of the p-side pad electrode 52p when viewed planarly.

Thereby, current flows from the p-side pad electrode 52p toward each of the two first contact electrode portions 41A and 41B, and dispersion of the current density distribution is achieved. As a result, luminescence distribution of the semiconductor light emitting device 122 is made uniform.

Figure 14:
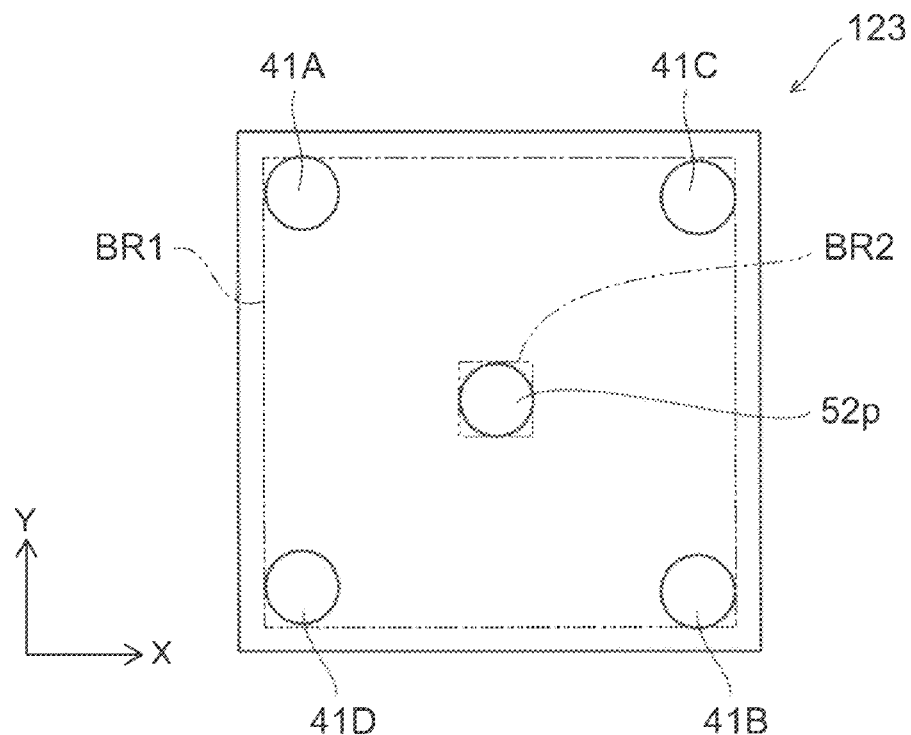
FIG. 14 is a schematic plan view illustrating a third example.

FIG. 14 is a schematic plan view illustrating a third example.

As illustrated in FIG. 14, in a semiconductor light emitting device 123 illustrating in the third example, a p-side pad electrode 52p is provided between four first contact electrode portions 41A, 41B, 41C, and 41D.

The four first contact electrode portions 41A, 41B, 41C, and 41D are disposed in each of the four corners of the rectangular semiconductor light emitting device 123. The p-side pad electrode 52p is disposed between the four first contact electrode portions 41A, 41B, 41C, and 41D, for example, in a center of the semiconductor light emitting device 123, when viewed planarly.

In the semiconductor light emitting device 123, the p-side pad electrode 52p is provided on an inner side of a circumscribed rectangle BR1 of the four first contact electrode portions 41A, 41B, 41C, and 41D when viewed planarly. Additionally, the four first contact electrode portions 41A, 41B, 41C, and 41D are each provided on an outer side of a circumscribed rectangle BR2 of the p-side pad electrode 52p when viewed planarly.

Thereby, current flows from the p-side pad electrode 52p toward each of the two first contact electrode portions 41A and 41B, and dispersion of the current density distribution is achieved. As a result, luminescence distribution of the semiconductor light emitting device 123 is made uniform.

Figure 15:
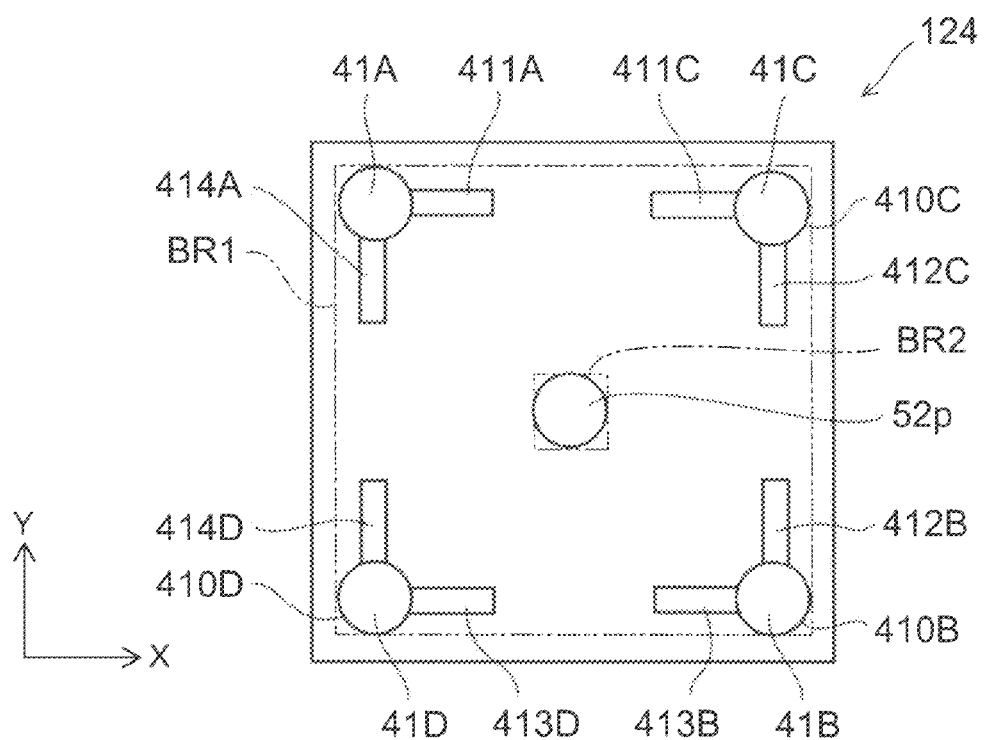
FIG. 15 is a schematic plan view illustrating a fourth example.

FIG. 15 is a schematic plan view illustrating a fourth example.

As illustrated in FIG. 15, in a semiconductor light emitting device 124 illustrating in the fourth example, a p-side pad electrode 52p is provided between four first contact electrode portions 41A, 41B, 41C, and 41D.

The four first contact electrode portions 41A, 41B, 41C, and 41D are disposed in each of the four corners of the rectangular semiconductor light emitting device 124. The p-side pad electrode 52p is disposed between the four first contact electrode portions 41A, 41B, 41C, and 41D, for example, in a center of the semiconductor light emitting device 124, when viewed planarly.

In the semiconductor light emitting device 124, two extending parts 411A and 414A are included in the first contact electrode portion 41A. Additionally, two extending parts 412B and 413B are included in the first contact electrode portion 41B. Additionally, two extending parts 411C and 412C are included in the first contact electrode portion 41C. Additionally, two extending parts 413D and 414D are included in the first contact electrode portion 41D.

The extending part 411A extends in the X direction from a bulged portion 410A. The extending part 414A extends in the Y direction from the bulged portion 410A. Additionally, the extending part 412B extends in the Y direction from a bulged portion 410B. The extending part 413B extends in the X direction from the bulged portion 410B. The extending part 411C extends in the X direction from a bulged portion 410C. The extending part 412C extends in the Y direction from the bulged portion 410C. Additionally, the extending part 413D extends in the X direction from a bulged portion 410D. The extending part 414D extends in the Y direction from the bulged portion 410D.

In the semiconductor light emitting device 124, the p-side pad electrode 52p is provided on an inner side of a circumscribed rectangle BR1 of the four first contact electrode portions 41A, 41B, 41C, and 41D when viewed planarly. Additionally, the four first contact electrode portions 41A, 41B, 41C, and 41D are each provided on an outer side of a circumscribed rectangle BR2 of the p-side pad electrode 52p when viewed planarly.

Thereby, current flows from the p-side pad electrode 52p toward each of the four first contact electrode portions 41A, 41B, 41C, and 41D, and dispersion of the current density distribution is achieved. As a result, luminescence distribution of the semiconductor light emitting device 124 is made uniform.

In the examples described above, examples having two and four of the first contact electrode portions 41 are described, but three or five or more of the first contact electrode portions 41 may be provided.

Additionally, the shapes, when viewed planarly, of the p-side pad electrode 52p and the first contact electrode portion 41 are not limited to the examples described above.

(Third Embodiment)

Next, a semiconductor light emitting device according to a third embodiment will be described.

The semiconductor light emitting device according to the third embodiment is an example in which the first conductivity type is p-type, and the second conductivity type is n-type.

Figure 16:
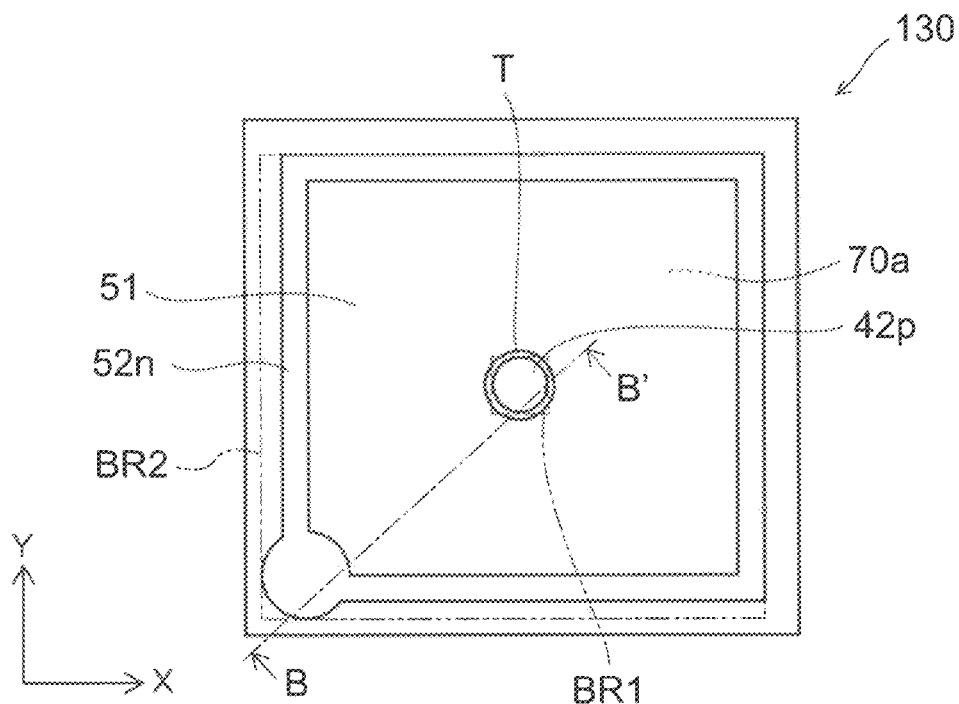
FIG. 16 is a schematic plan view illustrating a semiconductor light emitting device according to a third embodiment.

FIG. 16 is a schematic plan view illustrating a semiconductor light emitting device according to a third embodiment.

Figure 17:
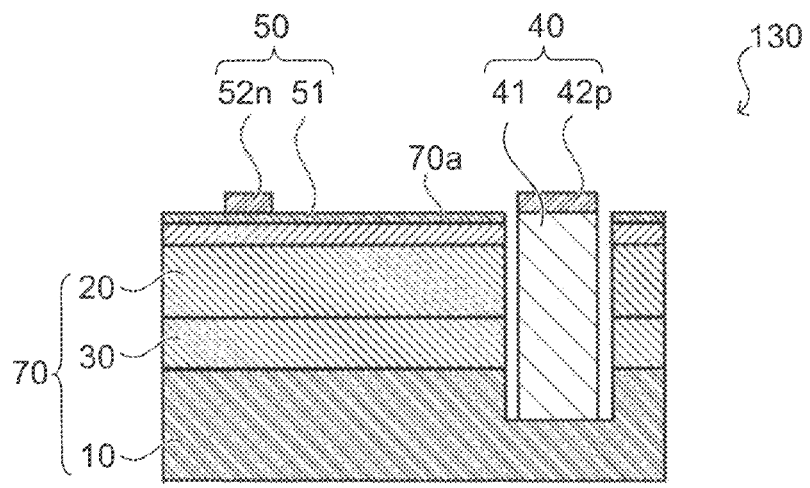
FIG. 17 is a schematic cross-sectional view taken along the line B-B' illustrated in FIG. 16.

FIG. 17 is a schematic cross-sectional view taken along the line B-B' illustrated in FIG. 16.

As illustrated in FIG. 17, a semiconductor light emitting device 130 according to the third embodiment includes a stacked structural body 70, a first electrode 40, and a second electrode 50. The stacked structural body 70 includes a p-type (the first conductivity type) first semiconductor layer 10, an n-type (the second conductivity type) second semiconductor layer 20, and a light emitting portion 30 provided between the first semiconductor layer 10 and the second semiconductor layer 20.

The first electrode 40 includes a first contact electrode portion 41 in contact with a face 10a of the first semiconductor layer 10 exposed by selectively removing the second semiconductor layer 20 and the light emitting portion 30 of a first major surface 70a on a second semiconductor layer 20 side of the stacked structural body 70. In other words, a part of the first semiconductor layer 10 is exposed when viewed in a first direction from the second semiconductor layer 20 to the first semiconductor layer 10. The second electrode 50 includes a second contact electrode portion 51 that has translucency and is in contact with the second semiconductor layer 20.

A sheet resistance of the second contact electrode portion 51 is less than a sheet resistance of the first semiconductor layer 10.

A p-side pad electrode 42p is provided on the first contact electrode portion 41. Additionally, an n-side pad electrode 52n is provided on the second contact electrode portion 51.

As illustrated in FIG. 16, in the semiconductor light emitting device 130 according to this embodiment, when viewed planarly from the second semiconductor layer 20 side of the stacked structural body 70, the n-side pad electrode 52n is provided farther outward than a circumscribed rectangle BR1 of the first contact electrode portion 41. Furthermore, the first contact electrode portion 41 is provided farther inward than a circumscribed rectangle BR2 of the n-side pad electrode 52n.

Thereby, current flows in a radiation direction from the first contact electrode portion 41 provided with the p-side pad electrode 42p toward the n-side pad electrode 52n, and, due to the current density distribution being dispersed, uniformization of the luminescence distribution is achieved.

Figure 18A:
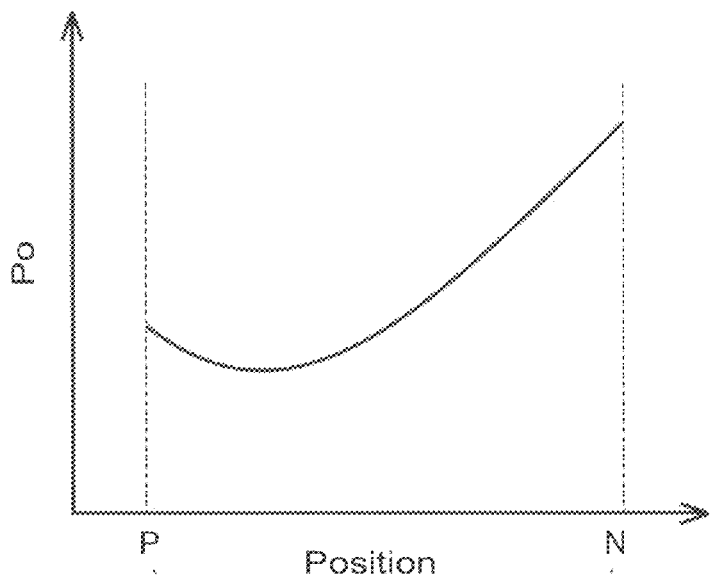
FIG. 18A is a graph showing output against position and FIG. 18B is a schematic view of p p-side pad electrode and an n-side electrode.
Figure 18B:
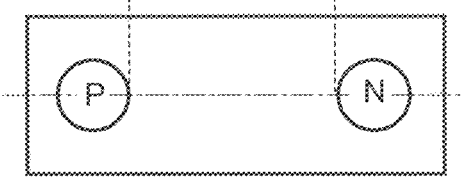
Figure 19A:
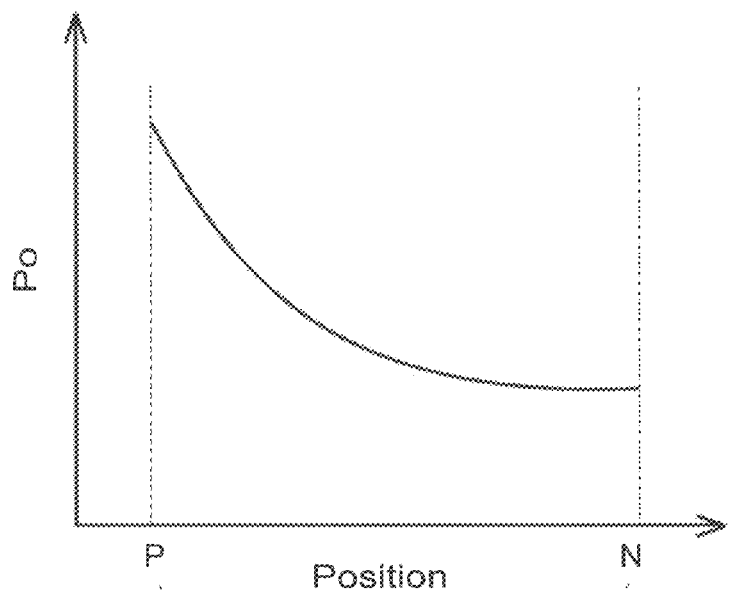
FIG. 19A is a graph showing output against position and FIG. 19B is a schematic view of p p-side pad electrode and an n-side electrode.
Figure 19B:
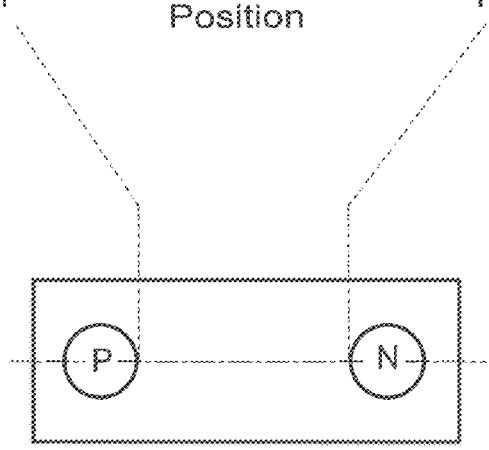
Figure 20A:
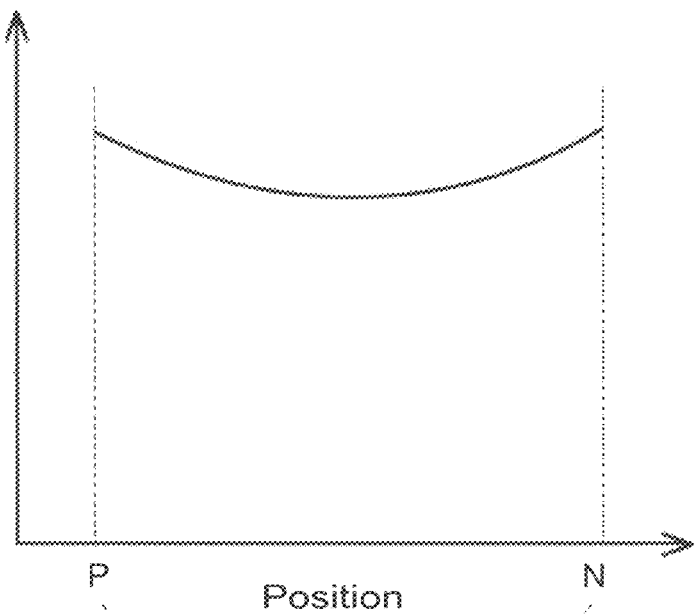
FIG. 20A is a graph showing output against position and FIG. 20B is a schematic view of p p-side pad electrode and an n-side electrode.
Figure 20B:
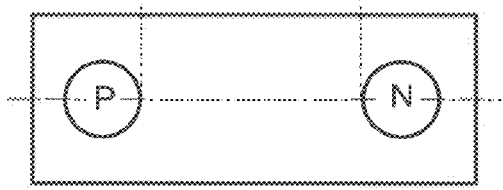

FIGS. 18 to 20 are graphs showing output against position when the p-side pad electrode that is a p-side electrode and the first contact electrode portion that is an n-side electrode are disposed symmetrically.

In these graphs, positions between the p-side and the n-side electrodes are shown on the horizontal axes and luminous intensities Po are shown on the vertical axes.

FIG. 18 illustrates a case where the sheet resistance Rt of the second contact electrode portion 51 is less than the sheet resistance Rn of the n-type contact layer 12.

In this case, because current is prone to accumulate in the n-side electrode, the luminous intensity Po increases from a position partway between the p-side and the n-side electrodes to the n-side electrode.

FIG. 19 illustrates a case where the sheet resistance Rt is greater than the sheet resistance Rn.

In this case, because current is prone to accumulate in the p-side electrode, the luminous intensity Po is greatest in the vicinity of the p-side electrode, and the luminous intensity Po decreases with proximity to the n-side electrode.

FIG. 20 illustrates a case where the sheet resistance Rt and the sheet resistance Rn are equivalent.

In this case, the luminous intensity Po is greatest in the vicinity of the p-side and the n-side electrodes, and the luminous intensity Po decreases with proximity to a midpoint between the p-side and the n-side electrodes.

Figure 21A:
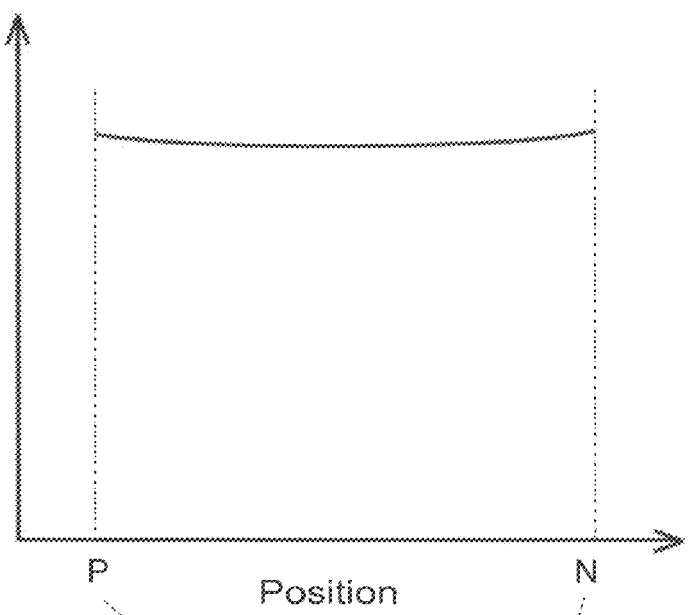
FIG. 21A is a graph showing output against position and FIG. 21B is a schematic view of p p-side pad electrode and an n-side electrode.
Figure 21B:
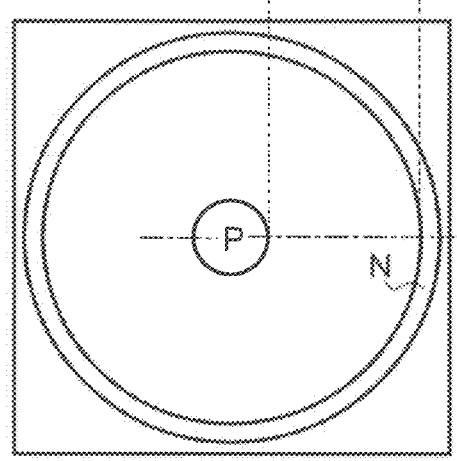
Figure 22A:
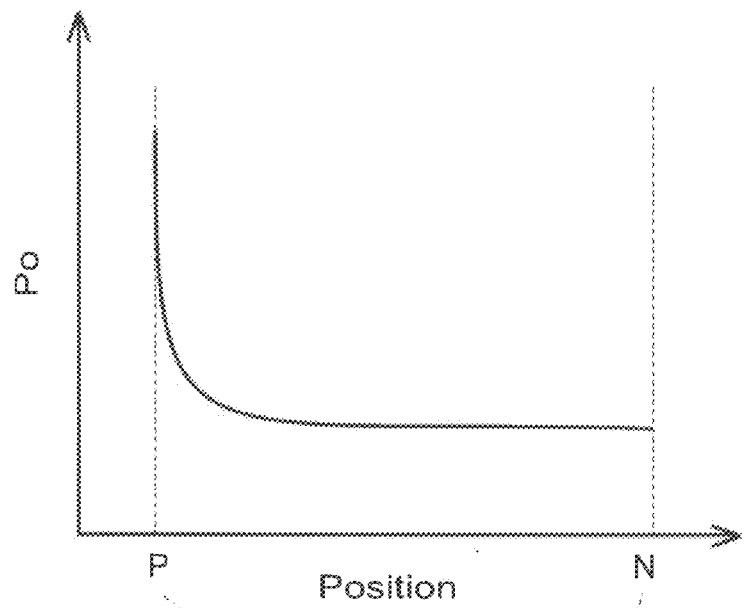
FIG. 22A is a graph showing output against position and FIG. 22B is a schematic view of p p-side pad electrode and an n-side electrode.
Figure 22B:
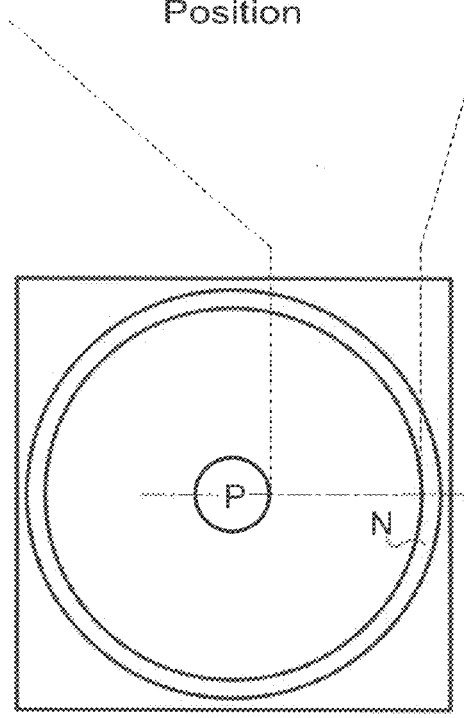
Figure 23A:
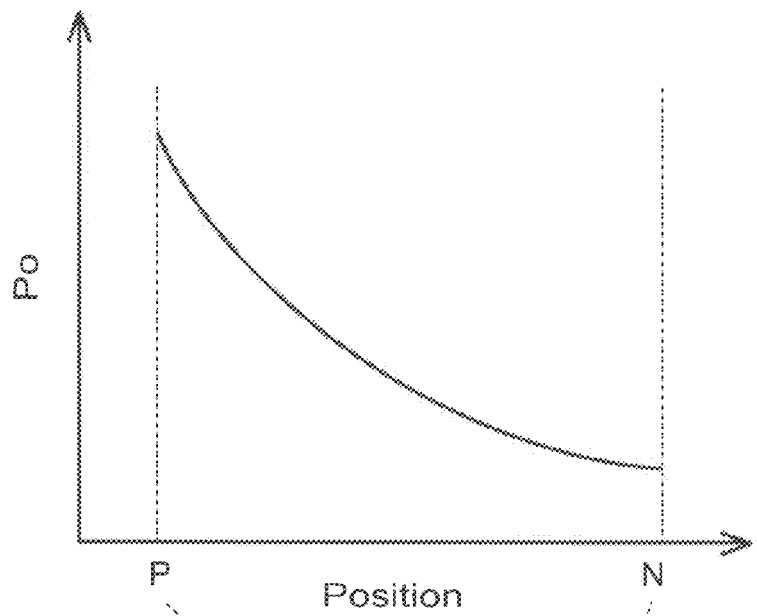
FIG. 23A is a graph showing output against position and FIG. 23B is a schematic view of p p-side pad electrode and an n-side electrode.
Figure 23B:
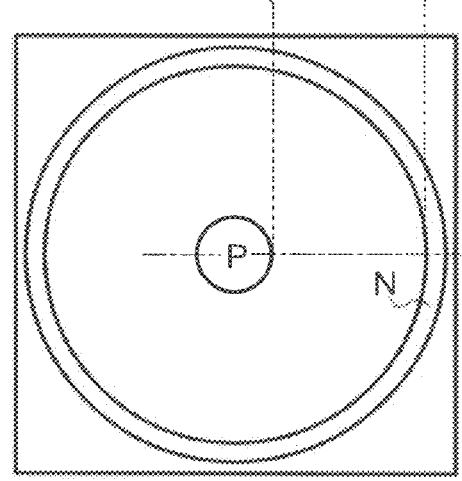

FIGS. 21 to 23 are graphs showing output against position when the first contact electrode portion that is an n-side electrode is disposed circularly around the p-side pad electrode that is a p-side electrode.

In these graphs, positions between the p-side and the n-side electrodes are shown on the horizontal axes and luminous intensities Po are shown on the vertical axes.

FIG. 21 illustrates a case where the sheet resistance Rt of the second contact electrode portion 51 is less than the sheet resistance Rn of the n-type contact layer 12.

In this case, current is prone to accumulate in the n-side electrode. However, because the n-side electrode is provided so as to surround the p-side electrode, the current flows radially from the p-side electrode toward the n-side electrode. In other words, the current is dispersed from the p-side electrode toward the n-side electrode. Therefore, because of the compounding of the accumulation of current at the n-side electrode due to the sheet resistance Rt<sheet resistance Rn relationship and the dispersion of the current from the p-side electrode to the n-side electrode, uniform luminous intensity Po is obtained from the p-side electrode to the n-side electrode.

FIG. 22 illustrates a case where the sheet resistance Rt is greater than the sheet resistance Rn.

In this case, current is prone to accumulate in the p-side electrode. Moreover, the current is also dispersed from the p-side electrode to the n-side electrode. Therefore, the luminous intensity Po is greatest in the vicinity of the p-side electrode, and the luminous intensity Po decreases significantly when distanced from the p-side electrode.

FIG. 23 illustrates a case where the sheet resistance Rt and the sheet resistance Rn are equivalent.

In this case, the luminous intensity Po gradually decreases from the p-side electrode to the n-side electrode.

The semiconductor light emitting device according to this embodiment displays the characteristics illustrated in FIG. 21. Specifically, because of the compounding of the luminescent characteristics of the sheet resistance Rt being less than the sheet resistance Rn and the current dispersing and flowing from the p-side electrode to the n-side electrode, a uniform luminous intensity Po is obtained.

As described above, with the semiconductor light emitting device according to this embodiment, it is possible to improve light extraction efficiency.

Note that in this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, in the formula described above, "nitride semiconductor" shall also be understood to include semiconductors further including group V elements other than N (nitrogen), semiconductors further including various elements added to suppress various physical properties such as conductivity type and the like, and semiconductors further including various elements that are included unintentionally.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a stacked structural body including:
      a first semiconductor layer of n-type,
      a light emitting portion provided on a first part of the first semiconductor layer, and
      a second semiconductor layer of p-type provided on the light emitting portion and apart from the first semiconductor layer in a first direction;
   a first electrode provided on a second part of the first semiconductor layer, the first electrode including a first contact electrode portion, the first contact electrode portion being in contact with the second part of the first semiconductor layer; and
   a second electrode provided on the second semiconductor layer, the second electrode including a second contact electrode portion and a p-side pad electrode, the second contact electrode portion being in contact with the second semiconductor layer, the p-side pad electrode being provided on a part of the second contact electrode portion, and transparency of the p-side pad electrode being lower than that of the second contact electrode portion,
   a sheet resistance of the second contact electrode portion being lower than a sheet resistance of the first semiconductor layer, and
   when projected onto a plane perpendicular to the first direction, the first contact electrode portion is provided to surround the p-side pad electrode.

2. The device according to claim 1, wherein
   the p-side pad electrode has a first opposing portion that faces the first contact electrode portion,
   the first contact electrode portion has a second opposing portion that faces the p-side pad electrode,
   a length, along a second direction orthogonal to the first direction, of the first opposing portion is shorter than a length, along the second direction, of the second opposing portion.

3. The device according to claim 1, wherein the first contact electrode portion surrounds an entirety of a periphery of the p-side pad electrode along the second direction.

4. The device according to claim 1, wherein the first contact electrode portion surrounds not less than 180 degrees of the periphery of the p-side pad electrode along the second direction.

5. The device according to claim 4, wherein the periphery along the second direction of the p-side pad electrode includes a portion that does not face the first contact electrode portion.

6. The device according to claim 1, wherein a minimum distance between an outer periphery of the p-side pad electrode and an inner periphery of the first contact electrode portion is constant along an entire circumference of the outer periphery of the p-side pad electrode.

7. The device according to claim 1, wherein the second electrode further includes an extending electrode extending radially, having the p-side pad electrode as a center.

8. The device according to claim 7, wherein the extending electrode extends toward a corner of the first contact electrode portion.

9. The device according to claim 1, wherein a plurality of the first contact electrode portions are provided.

10. The device according to claim 1, wherein a concentration of impurities in the first semiconductor layer is not less than $1 \times 10^{18}$ cm$^{-3}$ and not more than $1 \times 10^{19}$ cm$^{-3}$.

11. The device according to claim 1, wherein the sheet resistance of the second contact electrode portion is not less than 5 Ω/square and not more than 12 Ω/square.

12. The device according to claim 1, wherein the first semiconductor layer and the second semiconductor layer include a nitride semiconductor.

13. The device according to claim 1, wherein the light emitting portion has a multi quantum well structure.

14. The device according to claim 1, wherein the second contact electrode portion includes an oxide including indium and tin.

15. The device according to claim 1, wherein a shape of the first contact electrode portion when viewed in the first direction is a shape which surrounds an entirety of the periphery of the p-side pad electrode.

16. The device according to claim 9, wherein:
   the p-side pad electrode is provided in a center of a planar shape of the stacked structural body when viewed in the first direction; and
   the plurality of the first contact electrode portions are provided on corners of the planar shape of the stacked structural body.

17. The device according to claim 16, wherein each of the plurality of the first contact electrode portions includes two extending parts.

18. The device according to claim 9, wherein the p-side pad electrode is provided in a center of a planar shape of the stacked structural body when viewed in the first direction; and
   each of the plurality of the first contact electrode portions is provided on each of corners of the planar shape of the stacked structural body.

19. The device according to claim 18, wherein each of the plurality of the first contact electrode portions includes two extending parts.

20. The device according to claim 1, wherein
when viewed in the first direction, the p-side pad electrode is provided farther inward than a circumscribed rectangle of the first contact electrode portion, and the first contact electrode portion is provided farther outward than a circumscribed rectangle of the p-side pad electrode.

* * * * *